US011862521B2

(12) United States Patent
Volkovich et al.

(10) Patent No.: US 11,862,521 B2
(45) Date of Patent: Jan. 2, 2024

(54) MULTIPLE-TOOL PARAMETER SET CALIBRATION AND MISREGISTRATION MEASUREMENT SYSTEM AND METHOD

(71) Applicant: KLA CORPORATION, Milpitas, CA (US)

(72) Inventors: Roie Volkovich, Hadera (IL); Anna Golotsvan, Qiryat Tivon (IL)

(73) Assignee: KLA CORPORATION, Milpitas, CA (US)

( * ) Notice: Subject to any disclaimer, the term of this patent is extended or adjusted under 35 U.S.C. 154(b) by 509 days.

(21) Appl. No.: 16/956,357

(22) PCT Filed: Jun. 18, 2020

(86) PCT No.: PCT/US2020/038565
§ 371 (c)(1),
(2) Date: Jun. 19, 2020

(87) PCT Pub. No.: WO2020/257543
PCT Pub. Date: Dec. 24, 2020

(65) Prior Publication Data
US 2021/0366790 A1    Nov. 25, 2021

Related U.S. Application Data

(60) Provisional application No. 62/864,296, filed on Jun. 20, 2019.

(51) Int. Cl.
*H01L 21/66* (2006.01)
*G01B 11/26* (2006.01)

(52) U.S. Cl.
CPC .............. *H01L 22/20* (2013.01); *G01B 11/26* (2013.01)

(58) Field of Classification Search
CPC .......... H01L 22/20; H01L 22/12; G01B 11/26; G03F 7/70633; G06N 3/02; G06N 5/003; G06N 20/10
See application file for complete search history.

(56) References Cited

U.S. PATENT DOCUMENTS

2003/0223630 A1    12/2003   Adel et al.
2013/0132021 A1*    5/2013   Kwak ................. G03F 7/70608
                                                            356/402

(Continued)

FOREIGN PATENT DOCUMENTS

WO    2018153711 A1    8/2018
WO    2019108260 A1    6/2019

OTHER PUBLICATIONS

WIPO, ISR for International Application PCT/US2020/038565, dated Oct. 8, 2020.

*Primary Examiner* — Charles Cai
(74) *Attorney, Agent, or Firm* — HODGSON RUSS LLP (57) ABSTRACT

A multiple-tool parameter set calibration and misregistration measurement method useful in the manufacture of semiconductor devices including using at least a first reference misregistration metrology tool using a first set of measurement parameters to measure misregistration between at least two layers on a wafer of a batch of wafers, thereby generating a first misregistration data set, transmitting the first set of parameters and the data set to a calibrated set of measurement parameters generator (CSMPG) which processes the first set of parameters and the data set thereby generating a calibrated set of measurement parameters which are transmitted from the CSMPG to calibrate at least one initially-uncalibrated misregistration metrology tool based on the calibrated set of measurement parameters. Thereafter, misregistration is measured between at least two layers of at least one wafer, using at least the initially-uncalibrated (Continued)

misregistration metrology tool using the calibrated set of measurement parameters for the measuring.

24 Claims, 3 Drawing Sheets

(56) References Cited

U.S. PATENT DOCUMENTS

| | | | |
|---|---|---|---|
| 2013/0245985 A1* | 9/2013 | Flock | G05B 23/00 |
| | | | 702/105 |
| 2018/0107947 A1* | 4/2018 | Ogawa | G05B 19/4155 |
| 2018/0364669 A1* | 12/2018 | Bostick | G06N 20/00 |
| 2019/0086200 A1 | 3/2019 | Amit | |
| 2020/0064832 A1* | 2/2020 | Matsui | G05D 1/0297 |

\* cited by examiner

MULTIPLE-TOOL PARAMETER SET CALIBRATION AND MISREGISTRATION MEASUREMENT SYSTEM AND METHOD

REFERENCE TO RELATED APPLICATIONS

This application claims the priority from U.S. Provisional Patent Application 62/864,296 to Volkovich, filed Jun. 20, 2019 and entitled APPROACH FOR TOOL TO TOOL MATCHING CALIBRATION, the disclosure of which is hereby incorporated by reference and priority of which is hereby claimed.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a multiple-tool parameter set calibration and misregistration measurement method useful in the manufacture of semiconductor devices including using at least a first reference misregistration metrology tool using a first set of measurement parameters to measure misregistration between at least two layers on a wafer, the wafer being selected from a batch of wafers, thereby generating a first misregistration data set, and transmitting the first set of measurement parameters and the first misregistration data set to a calibrated set of measurement parameters generator (CSMPG). The method further includes processing the first set of misregistration parameters and the first misregistration data set, using the CSMPG, thereby generating a calibrated set of measurement parameters, and transmitting the calibrated set of measurement parameters from the CSMPG to at least one initially-uncalibrated misregistration metrology tool. The method additionally includes calibrating the at least one initially-uncalibrated misregistration metrology tool based on the calibrated set of measurement parameters, and thereafter measuring misregistration between at least two layers of at least one wafer, selected from the batch of wafers, using the at least one initially-uncalibrated misregistration metrology tool, the initially-uncalibrated misregistration metrology tool using the calibrated set of measurement parameters for the measuring.

In accordance with a preferred embodiment of the present invention, the calibrating the at least one initially-uncalibrated misregistration metrology tool includes calibrating a plurality of initially-uncalibrated misregistration metrology tools.

In accordance with a preferred embodiment of the present invention, the method further includes, prior to the generating of the calibrated set of measurement parameters, using a second reference misregistration metrology tool using a second set of measurement parameters to measure misregistration between the at least two layers on a wafer selected from the batch of wafers, thereby generating a second misregistration data set, and transmitting the second set of measurement parameters and the second misregistration data set from the second misregistration metrology tool to the calibrated set of measurement parameters generator (CSMPG), and processing the second set of misregistration parameters and the second misregistration data set, using the CSMPG, thereby generating the calibrated set of measurement parameters.

In accordance with a preferred embodiment of the present invention, processing the first set of misregistration parameters and the first misregistration data set includes using a CSMPG algorithm (CSMPGA).

In accordance with a preferred embodiment of the present invention, the CSMPGA includes a machine-learning algorithm. In accordance with a preferred embodiment of the present invention, the machine-learning algorithm includes at least one of: a neural network analysis, a principle component analysis, a support vector machine, a decision tree, and a gaussian process.

In accordance with a preferred embodiment of the present invention, the CSMPGA includes a regression analysis algorithm.

In accordance with a preferred embodiment of the present invention, the at least the first reference misregistration metrology tool and the at least one initially-uncalibrated misregistration metrology tool include scatterometry misregistration metrology tools. In accordance with a preferred embodiment of the present invention, the first set of measurement parameters includes at least one of: a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a polarization of light used in misregistration measurement, wavelengths of light used in misregistration measurement, a bandwidth of wavelengths of light used in misregistration measurement, an intensity of light used in misregistration measurement, a focal depth used in misregistration measurement, an apodizer used in misregistration measurement, and an optics channel used in misregistration measurement. In accordance with a preferred embodiment of the present invention, the first misregistration data set includes misregistration values. In accordance with a preferred embodiment of the present invention, the first misregistration data set includes one or more quality metrics selected from the group consisting of: accuracy flags, tool induced shift (TIS), Qmerit, focus sensitivity, pupil 3σ, normalized pupil 3σ (MEB), throughput and precision.

In accordance with a preferred embodiment of the present invention, the at least the first reference misregistration metrology tool and the initially-uncalibrated misregistration metrology tool are imaging misregistration metrology tools. In accordance with a preferred embodiment of the present invention, the first set of measurement parameters includes at least one of: a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a numerical aperture used in misregistration measurement, a polarization of light used in misregistration measurement, wavelengths of light used in misregistration measurement, a bandwidth of wavelengths of light used in misregistration measurement, an intensity of light used in misregistration measurement, a focal depth used in misregistration measurement, and a camera used in misregistration measurement. In accordance with a preferred embodiment of the present invention, the misregistration data set includes misregistration values. In accordance with a preferred embodiment of the present invention, the misregistration data set includes one or more quality metrics selected from the group consisting of: accuracy flags, tool induced shift (TIS), Qmerit, focus sensitivity, contrast precision, throughput and precision.

In accordance with a preferred embodiment of the present invention, the calibrated set of measurement parameters includes at least one of: a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a numerical aperture used in misregistration measurement, a polarization of light used in misregistration measurement, wavelengths of light used in misregistration measurement, a bandwidth of wavelengths of light used in misregistration measurement, an intensity of light used in misregistration measurement, a focal depth used in misregistration measurement, a camera used in misregistration measurement, a polarization of light used in misregistration measurement, an apodizer used in misregistration measurement, and an optics channel used in misregistration measurement.

There is also provided in accordance with another preferred embodiment of the present invention, a multiple-tool parameter set calibration and misregistration measurement system useful in the manufacture of semiconductor devices including at least a first reference misregistration metrology tool operative to use a first set of measurement parameters to measure misregistration between at least two layers on a wafer, the wafer being selected from a batch of wafers, thereby generating a first misregistration data set, at least a first initially-uncalibrated misregistration metrology tool operative to measure misregistration between at least two layers on a wafer selected from the batch of wafers, and a calibrated set of measurement parameters generator (CSMPG) operative to: receive from the at least the first reference misregistration metrology tool the first set of measurement parameters and the first misregistration data set, process the first set of measurement parameters and set first misregistration data set, thereby generating a calibrated set of measurement parameters, and communicate the calibrated set of measurement parameters from the CSMPG to the at least one initially-uncalibrated misregistration metrology tool to facilitate calibrating of the at least one initially-uncalibrated misregistration metrology tool.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
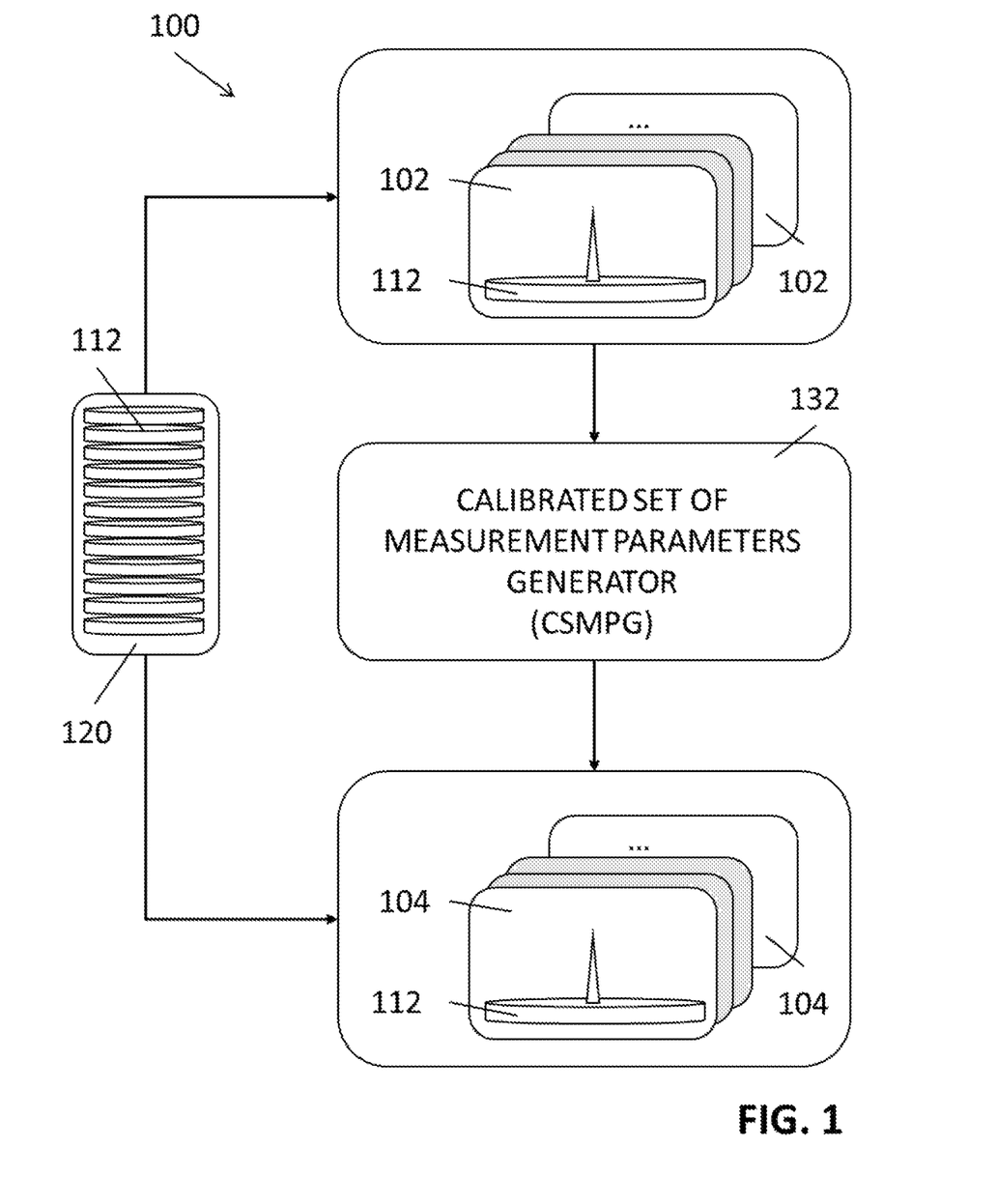
FIG. 1 is a simplified schematic illustration of a multiple-tool parameter set calibration and misregistration measurement system (MTPSCMMS)
Figure 2A:
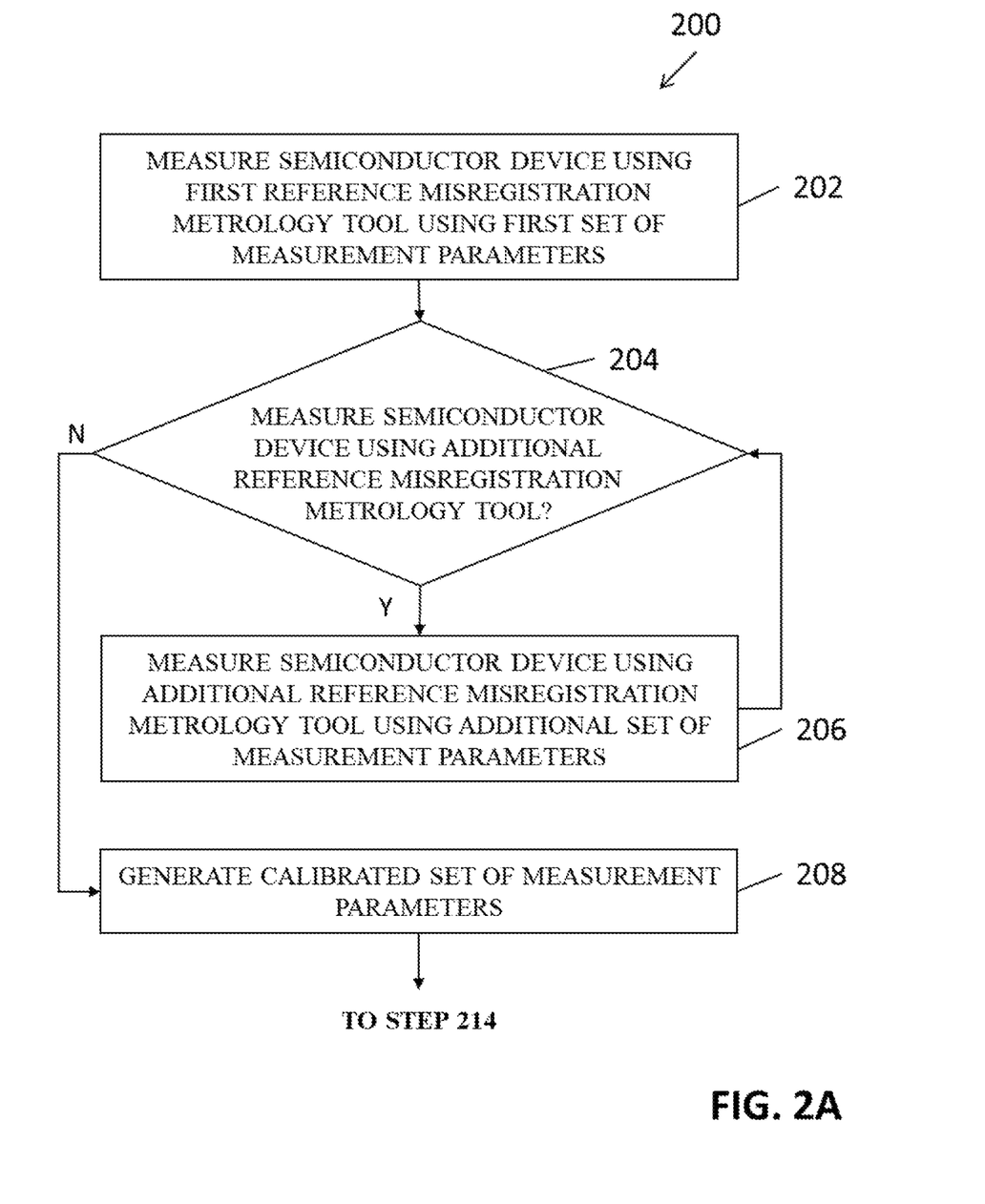
FIGS. 2A & 2B are together a simplified flow chart illustrating a multiple-tool parameter set calibration and misregistration measurement method (MTPSCMMM) useful by the MTPSCMMS of FIG. 1.
Figure 2B:
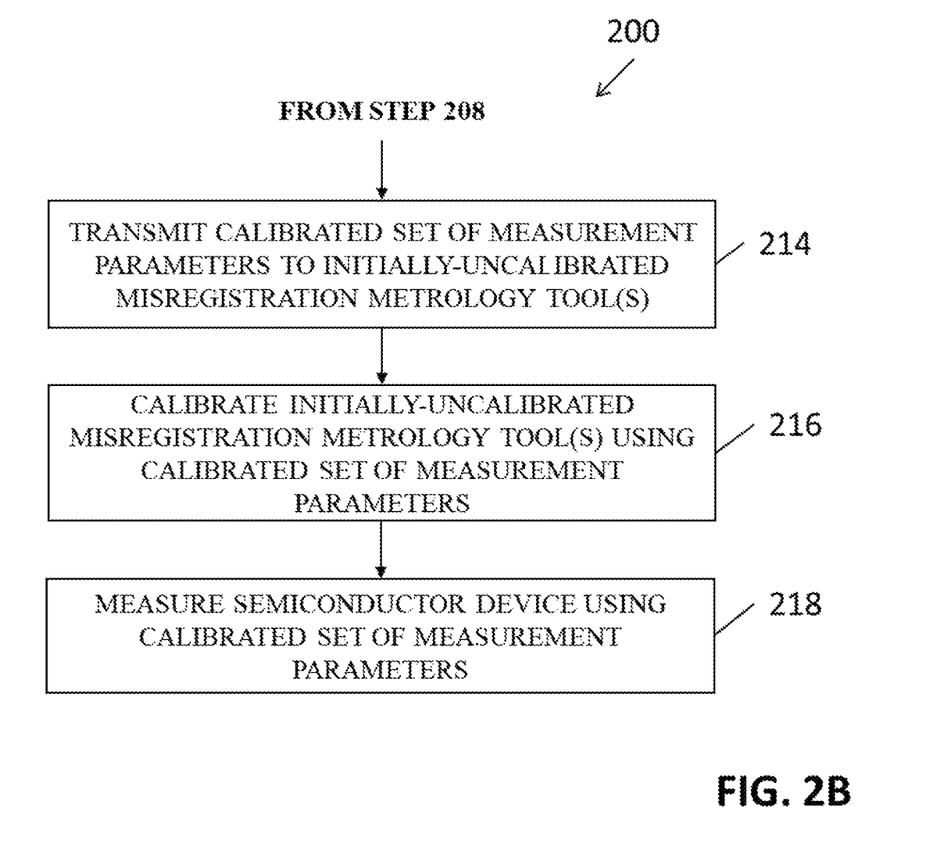

It is appreciated that the system and method described hereinbelow with reference to FIGS. 1-2B are used to measure misregistration between layers of a wafer on which semiconductor devices are formed and are part of a manufacturing process for semiconductor devices. The misregistration measured by the system and method described hereinbelow with reference to FIGS. 1-2B is used to adjust fabrication processes, such as lithography, during the manufacture of the semiconductor devices to ameliorate misregistration between various layers of the semiconductor devices being fabricated.

Reference is now made to FIG. 1, which is a simplified schematic illustration of a multiple-tool parameter set calibration and misregistration measurement system (MTPSCMMS) 100. As seen in FIG. 1, MTPSCMMS 100 includes at least one (e.g., two or more or a plurality of) reference misregistration metrology tool 102 and at least one (e.g., two or more or a plurality of) initially-uncalibrated misregistration metrology tool 104. Each of at least one reference misregistration metrology tool 102 is operative to measure misregistration between at least two layers formed on a wafer 112 using a respective set of measurement parameters. Wafer 112 preferably includes a plurality of semiconductor devices and is selected from a batch of wafers 120. The at least one reference misregistration metrology tool 102 thereby generates a respective misregistration data set. It is to be noted that each or any of the at least one reference misregistration metrology tools 102 and each or any of the initially-uncalibrated misregistration metrology tools 104 measures misregistration at a single site or at multiple sites on wafer 112.

In an embodiment of the present application, MTPSCMMS 100 is operative to use a first reference misregistration metrology tool 102 to measure misregistration between at least two layers formed on a wafer 112 using a first set of measurement parameters to generate a first misregistration data set. MTPSCMMS 100 is operative to (1) process the first set of measurement parameters and the first misregistration data set from first reference misregistration metrology tool 102, (2) generate a calibrated set of measurement parameters on the basis of the first set of measurement parameters and the first misregistration data set from the first reference misregistration metrology tool 102, and (3) calibrate at least one initially-uncalibrated misregistration metrology tool 104 (e.g., a plurality of initially-uncalibrated misregistration metrology tools 104) using the calibrated set of measurement parameters.

Once the at least one initially-uncalibrated misregistration metrology tools 104 is calibrated, initially-uncalibrated misregistration metrology tool 104 measures misregistration between at least two layers formed on wafer 112, using the calibrated set of measurement parameters.

It is to be noted that MTPSCMMS 100 is operative to use any number of reference misregistration metrology tools 102 to measure misregistration between at least two layers formed on wafer 112, each reference misregistration metrology tool 102 using a respective set of measurement parameters to generate a respective misregistration data set.

It is appreciated that each of various reference misregistration metrology tools 102 and each of initially-uncalibrated misregistration metrology tools 104 may measure misregistration between at least two layers of the same wafer 112 or of a different wafer 112 from batch of wafers 120.

In one embodiment of the present invention, each of wafers 112 in batch of wafers 120 undergoes the same fabrication steps and includes semiconductor devices which are intended to be identical to corresponding semiconductor devices on all other wafers 112 in batch of wafers 120.

In another embodiment of the present invention, at least one wafer 112 in batch of wafers 120 is intentionally fabricated differently than other wafers 112 in batch of wafers 120, typically as a design of experiment (DOE) wafer, which is fabricated using parameters that intentionally vary from other wafers 112 in batch of wafers 120.

Reference misregistration metrology tools 102 and initially-uncalibrated misregistration metrology tools 104 may be any suitable misregistration metrology tools. Preferably, all misregistration metrology tools 102 and 104 in MTPSCMMS 100 belong to a single category of misregistration metrology tools. Examples of categories of misregistration metrology tools include, inter alia, scatterometry misregistration metrology tools, imaging misregistration metrology tools and electron beam misregistration metrology tools.

A typical scatterometry misregistration metrology tool useful as misregistration metrology tools 102 and 104 is an ATL™ 100, commercially available from KLA Corporation of Milpitas, Calif., USA. A typical imaging misregistration metrology tool useful as misregistration metrology tools 102 and 104 is an Archer™ 750, commercially available from KLA Corporation of Milpitas, Calif., USA. A typical electron beam misregistration metrology tool useful as misregistration metrology tools 102 and 104 is an eDR7380™, commercially available from KLA Corporation of Milpitas, Calif., USA.

It is noted that while all misregistration metrology tools 102 and 104 of MTPSCMMS 100 preferably belong to a single category of misregistration metrology tools, each of misregistration metrology tools 102 and 104 of MTPSCMMS 100 need not be the same model of misregistration metrology tool.

For example, in an embodiment wherein misregistration metrology tools 102 and 104 belong to the imaging misregistration metrology tool category, one of misregistration metrology tools 102 and 104 may be an Archer™ 750 and another of misregistration metrology tools 102 and 104 may be an Archer™ 600 or any other suitable imaging misregistration metrology tool.

Similarly, in an embodiment wherein misregistration metrology tools 102 and 104 belong to the scatterometry misregistration metrology tool category, one of misregistration metrology tools 102 and 104 may be an ATL™ 100 and another of misregistration metrology tools 102 and 104 may be an ATL™ 150 or any other suitable scatterometry misregistration metrology tool.

Similarly, in an embodiment wherein misregistration metrology tools 102 and 104 belong to the electron beam misregistration metrology tool category, one of misregistration metrology tools 102 and 104 may be an eDR7380™ and another of misregistration metrology tools 102 and 104 may be an eDR7280™ or any other suitable electron beam misregistration metrology tool.

It is appreciated that MTPSCMMS 100 may include more than one, e.g., more than two, reference misregistration metrology tools 102 and more than one, e.g., more than two, initially-uncalibrated misregistration metrology tools 104. Preferably all misregistration metrology tools 102 and 104 in MTPSCMMS 100 belong to the same category, for example, all scatterometry misregistration metrology tools, all imaging misregistration metrology tools or all electron beam misregistration metrology tools.

MTPSCMMS 100 further includes a calibrated set of measurement parameters generator (CSMPG) 132. A first reference misregistration metrology tool 102 uses a first set of measurement parameters to measure misregistration between at least two layers on wafer 112, thereby generating a first misregistration data set. First reference misregistration metrology tool 102 transmits to CSMPG 132 the first set of measurement parameters and the first misregistration data set. The first misregistration data set generated by first reference misregistration metrology tool 102 includes, inter alia, misregistration values and quality metrics.

The misregistration values preferably include a magnitude and direction of misregistration between at least two layers of wafer 112 at one or more locations on wafer 112. The quality metrics may include, inter alia, accuracy flags, tool induced shift (TIS), Qmerit, focus sensitivity, throughput and precision. If reference misregistration metrology tool 102 is embodied as an imaging or electron beam misregistration metrology tool, the set of quality metrics may also include, for example, contrast precision. If reference misregistration metrology tool 102 is embodied as a scatterometry misregistration metrology tool, the set of quality metrics may also include, for example, pupil $3\sigma$, normalized pupil $3\sigma$ (MEB) and any additional suitable pupil data quality metrics.

CSMPG 132 is operative to receive from first reference misregistration metrology tool 102 the first set of measurement parameters and the first misregistration data set generated by first reference misregistration metrology tool 102, process the first set of measurement parameters and the first misregistration data set generated by first reference misregistration metrology tool 102, and, by processing the first set of measurement parameters and the first misregistration data set generated by first reference misregistration metrology tool 102, generate a calibrated set of measurement parameters. CSMPG 132 is operative to then communicate the calibrated set of measurement parameters to at least one initially-uncalibrated misregistration metrology tool 104 (e.g., a plurality of initially-uncalibrated misregistration metrology tools 104) in order to facilitate calibrating the at least one initially-uncalibrated misregistration metrology tool 104 (e.g., a plurality of initially-uncalibrated misregistration metrology tools 104) using the calibrated set of measurement parameters generated by CSMPG 132.

For some applications of the present invention, at least a second and/or additional reference misregistration metrology tool 102 is operative to use a second and/or additional set(s) of measurement parameters to measure misregistration between the at least two layers on wafer 112 selected from batch of wafers 120, to generate a second and/or additional misregistration data set. CSMPG 132 is operative to (a) receive from the first and the at least second and/or additional reference misregistration metrology tools 102 the respective first and second, and/or additional sets of measurement parameters as well as the respective first and second and/or additional misregistration data sets generated by first and the at least second and/or additional reference misregistration metrology tools 102 respectively, (b) process the respective first and second and/or additional sets of measurement parameters as well as respective first and second and/or additional misregistration data sets generated by first and at least second and/or additional reference misregistration metrology tools 102 respectively, and (c) by processing the respective first and second and/or additional sets of measurement parameters as well as the respective first and second and/or additional misregistration data sets generated by first and second and/or additional reference misregistration metrology tools 102 respectively, generate the calibrated set of measurement parameters. CSMPG 132 then communicates the calibrated set of measurement parameters to at least one initially-uncalibrated misregistration metrology tool 104 (e.g., a plurality of initially-uncalibrated misregistration metrology tools 104) in order to facilitate calibrating the at least one initially-uncalibrated misregistration metrology tool 104 (e.g., a plurality of initially-uncalibrated misregistration metrology tools 104) using the calibrated set of measurement parameters generated by CSMPG 132.

Both in the embodiment of the present invention wherein CSMPG 132 receives the set of measurements parameters and the misregistration data set from only first reference misregistration metrology tool 102 and in the embodiment of the present invention wherein CSMPG 132 receives the respective sets of measurements parameters and the respective misregistration data sets from a plurality of reference misregistration metrology tools 102, CSMPG 132 processes the set or sets of measurements parameters and the misregistration data set or sets to generate the calibrated set of measurement parameters for at least one initially-uncalibrated misregistration metrology tool 104. Preferably, CSMPG processes the set or sets of measurements parameters and the set of misregistration data using a CSMPG algorithm (CSMPGA).

CSMPGA may be any suitable algorithm, such as, inter alia, a machine-learning algorithm or a regression analysis algorithm. A suitable machine-learning algorithm may be, for example, a neural network analysis, a principle component analysis, a support vector machine, a decision tree or a gaussian process.

Preferably, as part of CSMPGA, CSMPG 132 models expected misregistration data sets for various sets of measurement parameters. CSMPG 132 compares the expected misregistration data sets generated by CSMPGA to each other, and any set of measurement parameters associated with a particularly desirable expected misregistration data set is identified by CSMPG 132 as the calibrated set of measurement parameters. A particularly desirable expected misregistration data set may be an expected misregistration data set having at least one of particularly desirable misregistration values and particularly desirable quality metrics.

The set of measurement parameters transmitted from reference misregistration metrology tool or tools 102 to CSMPG 132 as well as the calibrated set of measurement parameters communicated from CSMPG 132 to any of initially-uncalibrated misregistration metrology tools 104 may include, inter alia, a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a numerical aperture used in misregistration measurement, a polarization of light used in misregistration measurement, wavelengths of light used in misregistration measurement, a bandwidth of wavelengths of light used in misregistration measurement, an intensity of light used in misregistration measurement, a focal depth used in misregistration measurement, an apodizer used in misregistration measurement, an optics channel used in misregistration measurement and a camera used in misregistration measurement.

Reference is now made to FIGS. 2A & 2B, which are together a simplified flow chart illustrating a multiple-tool parameter set calibration and misregistration measurement method (MTPSCMMM) 200 useful by MTPSCMMS 100. As seen in FIG. 2A, at a first step 202, first reference misregistration metrology tool 102 uses a first set of measurement parameters to measure misregistration between at least two layers on wafer 112, selected from batch of wafers 120.

At a next step 204, a decision is made whether or not to measure either the same wafer 112 or an additional wafer 112, selected from batch of wafers 120, using an additional (e.g., a second) reference misregistration metrology tool 102 which uses a second set of measurement parameters to measure misregistration between at least two layers on wafer 112, selected from batch of wafers 120 in order to generate a second misregistration data set.

Then, at a next step 206, if either the same wafer 112 or an additional wafer 112, selected from batch of wafers 120, is to be measured using additional (e.g., the second) reference misregistration metrology tool 102, wafer 112 is measured using additional (e.g., the second) reference misregistration metrology tool 102 using additional set of measurement parameters. MTPSCMMM 200 then returns to step 204.

If either the same wafer 112 or an additional wafer 112, selected from batch of wafers 120, is not to be measured using an additional reference misregistration metrology tool 102, then at a next step 208, CSMPG 132 (*a*) receives the sets of measurement parameters and the misregistration data sets from step 202 and optionally from step 206, which are preferably transmitted to CSMPG 132 from first reference misregistration metrology tool 102 and from any additional (e.g., second) reference misregistration metrology tools 102, (b) processes the transmitted sets of measurement parameters and misregistration data sets, and (c) by the processing, generates a calibrated set of measurement parameters.

The sets of measurement parameters used in steps 202 and 206 may include, inter alia, a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a numerical aperture used in misregistration measurement, a polarization of light used in misregistration measurement, wavelengths of light used in misregistration measurement, a bandwidth of wavelengths of light used in misregistration measurement, an intensity of light used in misregistration measurement, a focal depth used in misregistration measurement, an apodizer used in misregistration measurement, an optics channel used in misregistration measurement and a camera used in misregistration measurement.

The misregistration data set or sets generated in steps 202 and 206 may include, inter alia, misregistration values and quality metrics. The misregistration values preferably include a magnitude and direction of misregistration between at least two layers of wafer 112 at one or more locations on wafer 112. The quality metrics may include, inter alia, accuracy flags, tool induced shift (TIS), Qmerit, focus sensitivity, throughput and precision. If reference misregistration metrology tool 102 is embodied as an imaging or electron beam misregistration metrology tool, the set of quality metrics may also include, for example, contrast precision. If reference misregistration metrology tool 102 is embodied as a scatterometry misregistration metrology tool, the set of quality metrics may also include, for example, pupil 3σ, normalized pupil 3σ (MEB) and any additional suitable pupil data quality metrics.

Preferably, at step 208, CSMPG 132 generates the calibrated set of measurement parameters using CSMPG algorithm (CSMPGA), which may be any suitable algorithm, such as, inter alia, a regression analysis algorithm or CSMPG-machine-learning algorithm (CSMPGMLA). CSMPGMLA may be any suitable algorithm, such as, inter alia, a neural network analysis, a principle component analysis, a support vector machine, a decision tree and a gaussian process.

Preferably, as part of CSMPGA, CSMPG 132 models expected misregistration data sets for various sets of measurement parameters. CSMPG 132 compares the expected misregistration data sets generated by CSMPGA to each other, and any set of measurement parameters associated with a particularly desirable expected misregistration data set is identified by CSMPG 132 as the calibrated set of measurement parameters. A particularly desirable expected misregistration data set may be an expected misregistration data set having at least one of particularly desirable misregistration values and particularly desirable quality metrics.

As a next step 214, the calibrated set of measurement parameters generated in step 208 is transmitted to one or more initially-uncalibrated misregistration metrology tools 104 in MTPSCMMS 100. In step 214, the one or more initially-uncalibrated misregistration metrology tools 104 is/are calibrated in accordance with and based upon the calibrated set of measurement parameters generated in step 208.

The calibrated set of measurement parameters of steps 208, 214, 216, and 218 which are communicated from CSMPG 132 to any of initially-uncalibrated misregistration metrology tools 104 may include, inter alia, a linear position of a wafer stage used in misregistration measurement, an azimuthal orientation of a wafer stage used in misregistration measurement, an elevation angular orientation of a wafer stage used in misregistration measurement, an axis along which misregistration is measured, a region of interest of a metrology target, a numerical aperture used in misregistration measurement, a polarization of light used in misregistration measurement, wavelengths of light used in misregistration measurement, a bandwidth of wavelengths of light used in misregistration measurement, an intensity of light used in misregistration measurement, a focal depth used in misregistration measurement, an apodizer used in misregistration measurement, an optics channel used in misregistration measurement and a camera used in misregistration measurement.

At a next step 218, MTPSCMMM 200 uses at least one of initially-uncalibrated misregistration metrology tools 104 used in steps 214 and 216 using the corresponding calibrated set or sets of measurement parameters generated at step 208, to measure misregistration between at least two layers of at least one wafer 112 from batch of wafers 120.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A multiple-tool parameter set calibration and misregistration measurement method useful in manufacture of semiconductor devices comprising:
using at least a first reference misregistration metrology tool using a first set of measurement parameters to measure misregistration between at least two layers on a wafer, said wafer being selected from a batch of wafers, thereby generating a first misregistration data set;
transmitting said first set of measurement parameters and said first misregistration data set to a calibrated set of measurement parameters generator (CSMPG);
processing said first set of measurement parameters and said first measurement data set, using said CSMPG, thereby generating a calibrated set of measurement parameters, wherein said calibrated set of measurement parameters comprises at least one of:
a linear position of a wafer stage used in misregistration measurement;
an azimuthal orientation of a wafer stage used in misregistration measurement;
an elevation angular orientation of a wafer stage used in misregistration measurement;
an axis along which misregistration is measured;
a region of interest of a metrology target;
a numerical aperture used in misregistration measurement;
a polarization of light used in misregistration measurement;
wavelengths of light used in misregistration measurement;
a bandwidth of wavelengths of light used in misregistration measurement;
an intensity of light used in misregistration measurement;
a focal depth used in misregistration measurement;
a camera used in misregistration measurement;
an apodizer used in misregistration measurement; and
an optics channel used in misregistration measurement;
transmitting said calibrated set of measurement parameters from said CSMPG to at least one initially-uncalibrated misregistration metrology tool;
calibrating said at least one initially-uncalibrated misregistration metrology tool based on said calibrated set of measurement parameters; and
thereafter measuring misregistration between at least two layers of at least one wafer, selected from said batch of wafers, by using said at least one initially-uncalibrated misregistration metrology tool using said calibrated set of measurement parameters.

2. The multiple-tool parameter set calibration and misregistration measurement method according to claim 1 and wherein said calibrating said at least one initially-uncalibrated misregistration metrology tool comprises calibrating a plurality of initially-uncalibrated misregistration metrology tools.

3. The multiple-tool parameter set calibration and misregistration measurement method according to claim 1 wherein:
the method further comprises, prior to said generating of said calibrated set of measurement parameters:
using a second reference misregistration metrology tool using a second set of measurement parameters to measure misregistration between said at least two layers on a wafer selected from said batch of wafers, thereby generating a second misregistration data set; and transmitting said second set of measurement parameters and said second misregistration data set from said second reference misregistration metrology tool to said CSMPG and processing said second set of measurement parameters and said second misregistration data set, using said CSMPG, thereby generating said calibrated set of measurement parameters.

4. The multiple-tool parameter set calibration and misregistration measurement method according to claim 1 and wherein said processing said first set of measurement parameters and said first misregistration data set comprises using a CSMPG algorithm (CSMPGA).

5. The multiple-tool parameter set calibration and misregistration measurement method according to claim 4 and wherein said CSMPGA comprises a machine-learning algorithm, and wherein said machine-learning algorithm comprises at least one of:
 a neural network analysis;
 a principle component analysis;
 a support vector machine;
 a decision tree; or
 a gaussian process.

6. The multiple-tool parameter set calibration and misregistration measurement method according to claim 4 and wherein said CSMPGA comprises a regression analysis algorithm.

7. The multiple-tool parameter set calibration and misregistration measurement method according to claim 1 and wherein said at least a first reference misregistration metrology tool and said at least one initially-uncalibrated misregistration metrology tool comprise scatterometry misregistration metrology tools, and wherein said first set of measurement parameters comprises at least one of:
 said linear position of said wafer stage used in said misregistration measurement;
 said azimuthal orientation of said wafer stage used in said misregistration measurement;
 said elevation angular orientation of said wafer stage used in said misregistration measurement;
 said axis along which misregistration is measured;
 said region of interest of said metrology target;
 said polarization of light used in said misregistration measurement;
 said wavelengths of light used in said misregistration measurement;
 said bandwidth of wavelengths of light used in said misregistration measurement;
 said intensity of light used in said misregistration measurement;
 said focal depth used in said misregistration measurement;
 said apodizer used in said misregistration measurement; or
 said optics channel used in said misregistration measurement.

8. The multiple-tool parameter set calibration and misregistration measurement method according to claim 7 and wherein said first misregistration data set comprises misregistration values.

9. The multiple-tool parameter set calibration and misregistration measurement method according to claim 7 and wherein said first misregistration data set comprises one or more quality metrics selected from the group consisting of: accuracy flags, tool induced shift (TIS), Qmerit, focus sensitivity, pupil 3σ, normalized pupil 3σ (MEB), throughput and precision.

10. The multiple-tool parameter set calibration and misregistration measurement method according to claim 1 and wherein said at least a first reference misregistration metrology tool and said at least one initially-uncalibrated misregistration metrology tool comprise imaging misregistration metrology tools, and wherein said first set of measurement parameters comprises at least one of:
 said linear position of said wafer stage used in said misregistration measurement;
 said azimuthal orientation of said wafer stage used in said misregistration measurement;
 said elevation angular orientation of said wafer stage used in said misregistration measurement;
 said axis along which misregistration is measured;
 said region of interest of said metrology target;
 said numerical aperture used in said misregistration measurement;
 said polarization of light used in said misregistration measurement;
 said wavelengths of light used in said misregistration measurement;
 said bandwidth of wavelengths of light used in said misregistration measurement;
 said intensity of light used in said misregistration measurement;
 said focal depth used in said misregistration measurement; or
 said camera used in said misregistration measurement.

11. The multiple-tool parameter set calibration and misregistration measurement method according to claim 10 and wherein said first misregistration data set comprises misregistration values.

12. The multiple-tool parameter set calibration and misregistration measurement method according to claim 10 and wherein said first misregistration data set comprises one or more quality metrics selected from the group consisting of: accuracy flags, tool induced shift (TIS), Qmerit, focus sensitivity, contrast precision, throughput and precision.

13. A multiple-tool parameter set calibration and misregistration measurement system useful in manufacture of semiconductor devices comprising:
 at least a first reference misregistration metrology tool operative to use a first set of measurement parameters to measure misregistration between at least two layers on a wafer, said wafer being selected from a batch of wafers, thereby generating a first misregistration data set;
 at least one initially-uncalibrated misregistration metrology tool operative to measure misregistration between at least two layers on a wafer selected from said batch of wafers; and
 a calibrated set of measurement parameters generator (CSMPG) operative to:
  receive from said at least a first reference misregistration metrology tool said first set of measurement parameters and said first misregistration data set;
  process said first set of measurement parameters and said first misregistration data set, thereby generating a calibrated set of measurement parameters, wherein said calibrated set of measurement parameters comprises at least one of:
   a linear position of a wafer stage used m misregistration measurement;
   an azimuthal orientation of a wafer stage used in misregistration measurement;
   an elevation angular orientation of a wafer stage used in misregistration measurement;

an axis along which misregistration is measured;
a region of interest of a metrology target;
a numerical aperture used in misregistration measurement;
a polarization of light used in misregistration measurement;
wavelengths of light used in misregistration measurement;
a bandwidth of wavelengths of light used in misregistration measurement;
an intensity of light used in misregistration measurement;
a focal depth used in misregistration measurement;
a camera used in misregistration measurement;
an apodizer used in misregistration measurement; and
an optics channel used in misregistration measurement; and
communicate said calibrated set of measurement parameters from said CSMPG to said at least one initially-uncalibrated misregistration metrology tool to facilitate calibrating of said at least one initially-uncalibrated misregistration metrology tool.

14. The multiple-tool parameter set calibration and misregistration measurement system according to claim 13 and wherein said at least one initially-uncalibrated misregistration metrology tool comprises a plurality of initially-uncalibrated misregistration metrology tools and wherein said calibrated set of measurement parameters generator (CSMPG) is configured to communicate said calibrated set of measurement parameters to said plurality of initially-uncalibrated misregistration metrology tools in order to calibrate said plurality of initially-uncalibrated misregistration metrology tools.

15. The multiple-tool parameter set calibration and misregistration measurement system according to claim 13 and further comprising a second reference misregistration metrology tool operative to use a second set of measurement parameters to measure misregistration between at least two layers on a wafer selected from said batch of wafers, thereby generating a second misregistration data set, and wherein said CSMPG is operative to:
receive from said second reference misregistration metrology tool said second set of measurement parameters and said second misregistration data set; and
process said second set of measurement parameters and said second misregistration data set, thereby generating said calibrated set of measurement parameters.

16. The multiple-tool parameter set calibration and misregistration measurement system according to claim 13 and wherein said CSMPG is configured to generate said calibrated set of measurement parameters by using a CSMPG algorithm (CSMPGA).

17. The multiple-tool parameter set calibration and misregistration measurement system according to claim 16 and wherein said CSMPGA comprises a machine-learning algorithm, and wherein said machine-learning algorithm comprises at least one of:
a neural network analysis;
a principle component analysis;
a support vector machine;
a decision tree; or
a gaussian process.

18. The multiple-tool parameter set calibration and misregistration measurement system according to claim 16 and wherein said CSMPGA comprises a regression analysis algorithm.

19. The multiple-tool parameter set calibration and misregistration measurement system according to claim 13 and wherein said at least a first reference misregistration metrology tool and said at least one initially-uncalibrated misregistration metrology tool comprise scatterometry misregistration metrology tools, and wherein said first set of measurement parameters comprises at least one of:
said linear position of said wafer stage used in said misregistration measurement;
said azimuthal orientation of said wafer stage used in said misregistration measurement;
said elevation angular orientation of said wafer stage used in said misregistration measurement;
said axis along which misregistration is measured;
said region of interest of said metrology target;
said polarization of light used in said misregistration measurement;
said wavelengths of light used in said misregistration measurement;
said bandwidth of wavelengths of light used in said misregistration measurement;
said intensity of light used in said misregistration measurement;
said focal depth used in said misregistration measurement;
said apodizer used in said misregistration measurement; or
said optics channel used in said misregistration measurement.

20. The multiple-tool parameter set calibration and misregistration measurement system according to claim 19 and wherein said first misregistration data set comprises misregistration values.

21. The multiple-tool parameter set calibration and misregistration measurement system according to claim 19 and wherein said first misregistration data set comprises one or more quality metrics selected from the group consisting of: accuracy flags, tool induced shift (TIS), Qmerit, focus sensitivity, pupil 3σ, normalized pupil 3σ (MEB), throughput and precision.

22. The multiple-tool parameter set calibration and misregistration measurement system according to claim 13 and wherein said at least a first reference misregistration metrology tool and said at least one initially-uncalibrated metrology tool comprise imaging misregistration metrology tools, and wherein said first set of measurement parameters comprises at least one of:
said linear position of said wafer stage used in said misregistration measurement;
said azimuthal orientation of said wafer stage used in said misregistration measurement;
said elevation angular orientation of said wafer stage used in said misregistration measurement;
said axis along which misregistration is measured;
said region of interest of said metrology target;
said numerical aperture used in said misregistration measurement;
said polarization of light used in said misregistration measurement;
said wavelengths of light used in said misregistration measurement;
said bandwidth of wavelengths of light used in said misregistration measurement;
said intensity of light used in said misregistration measurement;
said focal depth used in said misregistration measurement; or
said camera used in said misregistration measurement.

23. The multiple-tool parameter set calibration and misregistration measurement system according to claim 22 and wherein said first misregistration data set comprises misregistration values.

24. The multiple-tool parameter set calibration and misregistration measurement system according to claim 22 and wherein said first misregistration data set comprises one or more quality metrics selected from the group consisting of: accuracy flags, tool induced shift (TIS), Qmerit, focus sensitivity, contrast precision, throughput and precision.

* * * * *